United States Patent [19]
Popescu

[11] Patent Number: 5,389,886
[45] Date of Patent: Feb. 14, 1995

[54] QUADRATURE SIGNALS FREQUENCY DOUBLER

[75] Inventor: Petre Popescu, Kanata, Canada

[73] Assignee: Northern Telecom Limited, Montreal, Canada

[21] Appl. No.: 150,907

[22] Filed: Nov. 12, 1993

[51] Int. Cl.⁶ .................................. H03B 19/00
[52] U.S. Cl. ........................ 327/120; 377/47; 327/119; 327/122; 327/233
[58] Field of Search ............... 307/262, 269, 271; 328/20, 55, 133, 155; 377/47

[56] References Cited

U.S. PATENT DOCUMENTS

| | | | |
|---|---|---|---|
| 3,676,660 | 7/1972 | Miller | 235/186 |
| 3,800,088 | 3/1974 | Bode | 381/61 |
| 4,006,417 | 2/1977 | Pace | 328/20 |
| 4,359,688 | 11/1982 | Haville | 328/20 |
| 4,648,021 | 3/1987 | Alberkrack | 328/20 |
| 4,663,541 | 5/1987 | Larrowe | 328/20 |

OTHER PUBLICATIONS

"A 3Gb/s Bipolar Phase Shifter and AGC Amplifier", IEEE International Sold-State Circuits Conference, 1989, pp. 144-145.

Primary Examiner—Terry D. Cunningham
Attorney, Agent, or Firm—George MacGregor

[57] ABSTRACT

A circuit for generating a pair of quadrature output signals from a pair of quadrature input signals in which the frequency of the output signals is double that of the input. The circuit consists of two dual phase shifters, two symmetrical multipliers and a phase controller. The circuit is fabricated by conventional integrated circuit processing technology. A method of generating frequency doubled quadrature output signals is disclosed.

15 Claims, 3 Drawing Sheets

QUADRATURE SIGNALS FREQUENCY DOUBLER

FIELD OF THE INVENTION

This invention relates to a circuit for processing quadrature signals and more particularly to a circuit, preferably an integrated circuit capable of processing a pair of quadrature input signals so as to generate a pair of quadrature output signals having a frequency that is double the frequency of the input signals.

BACKGROUND OF THE INVENTION

Quadrature signals, i.e. signals having the same frequency but a phase difference of 90° ($\pi/2$), are used with many circuits and find particular application in circuits for fibre optic transmission systems and wireless communications. One important property of quadrature signals is that they can be multiplied to generate signals having a frequency that is double the frequency of the original signals. If the two quadrature signals are:

$$a = A \sin(wt + \phi)$$

and $$b = A \cos(wt + \phi)$$

then by multiplying the two signals the result can be written:

$$c = \frac{kA^2}{2} \sin(2wt + \phi)$$

where k is the multiplier gain.

The quadrature signals frequency doubler circuit of the present invention generates two quadrature output signals having a frequency equal to double the frequency of the two quadrature input signals utilizing conventional integrated circuit fabrication technology.

PRIOR ART

As discussed previously it is a property of quadrature signals that they can be multiplied to generate quadrature signals having double the frequency of the input signals. In U.S. Pat. No. 3,626,308, which issued Dec. 7, 1971 to T. O. Paine et al, a wide-band signal quadrature and second harmonic generator is disclosed. A voltage-controlled phase shifter is used to generate an output representing a phase shifted sine input signal. A photoresistor is used to control the output signal. The frequency range of this circuit is limited to the range 100 Hz to 100 kHz and includes components not compatible with integrated circuit fabrication. U.S. Pat. No. 3,676,660, which issued Jul. 11, 1972 to L. R. Miller, relates to an analog computer and a circuit that generates quadrature gating signals at both a first frequency and a second frequency equal to twice the first frequency. The circuit requires frequency doubler stages, amplifiers and filters, i.e. the circuit is very complex and not applicable to I.C. fabrication.

In the present invention a pair of dual phase shifters is used to generate the phase difference between signals. The use of phase shifters in related technology is known. For example, P. A. Dawson and S. P. Rogerson in the IEEE Journal of Lightwave Technology, Vol. LT-2, No. 6, pp. 926-932, December 1984, describe a phase shifter circuit consisting of two differential stages with connected outputs. The input of the second stage is delayed by $\phi_{max}$ which delay is generated by an off-chip, fixed delay line and accordingly a continuously variable frequency of operation can not be achieved. H. M. Rein et al at the IEEE International Solid-State Circuits Conference 1989 describe in a paper entitled "A 3Gb/s Bipolar Phase Shifter and AGC Amplifier", a digital version of the circuit disclosed by Dawson at al. This circuit according to Rein et al utilizes a static master/slave flip-flop version of a frequency divider for the generation of a phase difference. The signal is halved prior to phase shifting followed by a doubling stage to get the original frequency. A wide-band low-pass filter is used to obtain continuous output signals from the phase-shifting stage. This filtering stage restricts the operable frequency range.

SUMMARY OF THE INVENTION

It is an object of the present invention to provide a circuit which is capable of generating, from a pair of quadrature input signals of a first frequency, a pair of quadrature output signals of a second frequency which preferably is double the first frequency.

It is a further object of the invention to provide a circuit which can operate at any frequency from DC to the maximum operating frequency allowed by the technology used for implementation.

It is yet a further object of the invention to provide n circuits which can be cascaded for a multiplication factor of $2^n$.

Therefore in accordance with a first aspect of the present invention there is provided a circuit adapted to receive a pair of quadrature input signals of a first frequency and to generate a pair of quadrature output signals of a second frequency, the second frequency being greater than the first. The circuit comprises a pair of dual phase shifters each having input means to independently receive the pair of input signals and to genereate a pair of output signals having a phase difference therebetween. Control means is connected to each of said pair of dual phase shifters, the control means having phase adjusting means to control the phase difference between the pair of output signals. A pair of symmetrical multipliers are provided, each of the pair receive the pair of output signals from the phase shifters and generate a pair of quadrature output signals having a second frequency which according to a preferred embodiment is double the frequency of the input signals. A biasing sub-circuit is provided which supplies operating voltage to each element of the main circuit.

According to a second aspect of the invention there is provided a method of generating a pair of quadrature output signals from a pair of quadrature input signals the output signals having a frequency which is double the frequency of the input signals. The method includes the steps of supplying the pair of quadrature input signals to a pair of dual phase shifters, each of the phase shifters having means to generate a pair of phase shifted output signals. A differential phase control signal is generated in a phase controller and this signal is supplied to each of the dual phase shifters to control the phase between the phase shifted output signals. The phase shifted output signals are supplied to a pair of symmetrical multipliers which generate the pair of quadrature output signals having a frequency which is double the frequency of the quadrature input signals.

DETAILED DESCRIPTION OF THE INVENTION

For identification purposes the quadrature input signals will be identified as (hck,hckb) and (hckq,hckqb). The quadrature output signals are identified as (ck,ckb) and (ckq,ckqb). The phase difference between hck and hckq and between ck and ckq is 90°. All input and output signals are of differential type.

Figure 1:
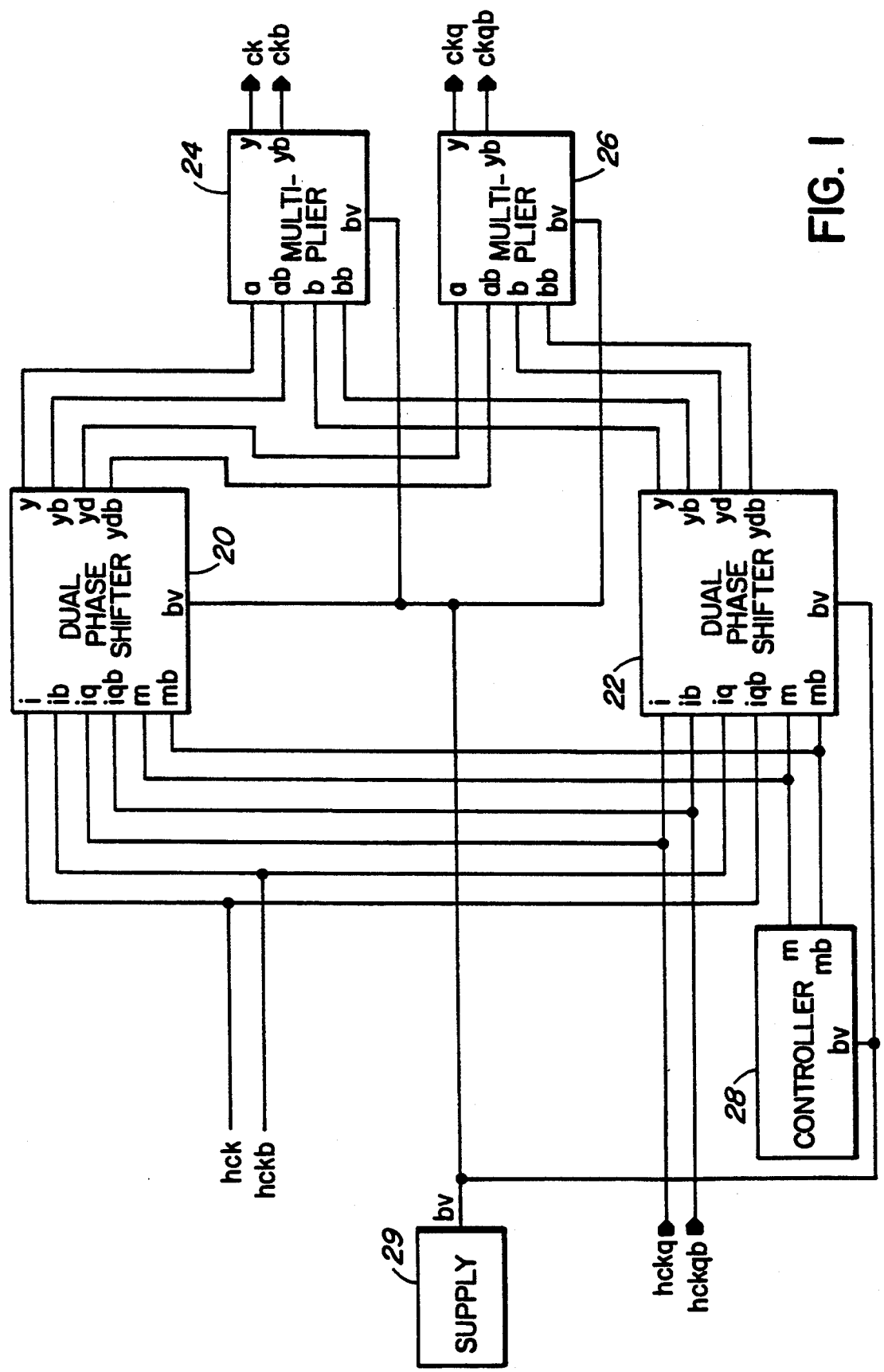
FIG. 1 is a block diagram of the frequency doubler circuit of the present invention.

As shown in FIG. 1 each of the pair of quadrature input signals (hck,hckb) and (hckq,hckqb) is coupled to a pair of dual phase shifters 20, 22. Respective outputs of each of the pair of dual phase shifters are coupled to each of a pair of symmetrical multipliers 24, 26. Dual phase shifter controller 28 under control of bias voltage supplied by a power supply 29 provides phase control to each of the phase shifters 20, 22. Quadrature output signals (ck,ckb) and (ckq,ckqb) as shown in FIG. 1 are generated by multipliers 24, 26.

Figure 2:
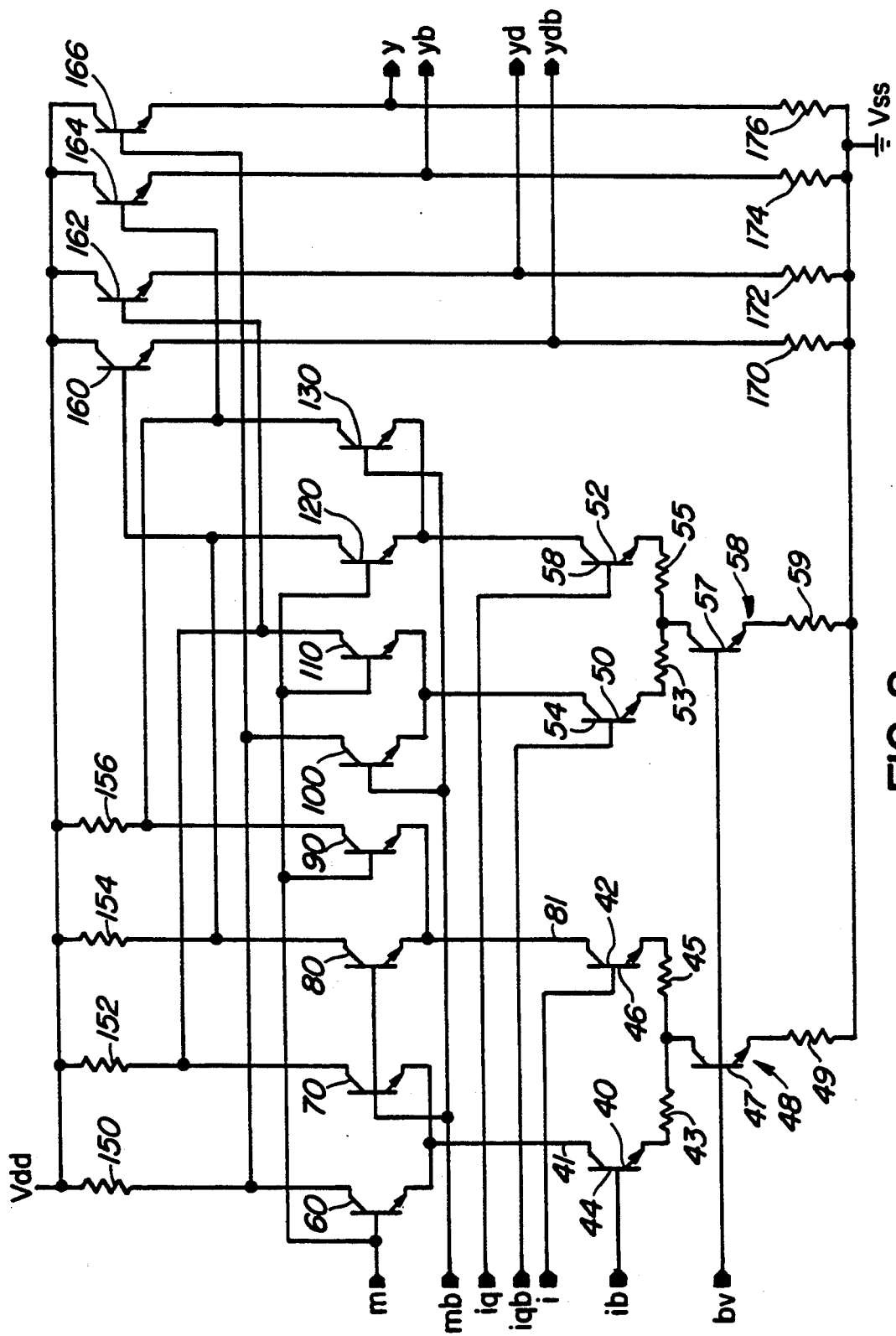
FIG. 2 is a schematic diagram of one of the dual phase shifters.

The dual phase shifter as seen in FIG. 2 comprises two multipliers each having their outputs connected as two summing amplifiers. As shown in FIG. 1 the quadrature input signals are supplied to input terminals of the phase shifters as follows:

| input | phase shifter 20 | phase shifter 22 |
| --- | --- | --- |
| hck | i | iqb |
| hckb | ib | iq |
| hckq | i | iq |
| hckqb | iqb | ib |

The outputs from each dual phase shifter are identified as (y,yb) and (yd,ydb).

It is to be noted that the input signals are of differential type for generality. If desired they can be single ended in which case ib and iqb will be substituted with reference voltages Vref and Vrefq respectively.

The manner in which these signal are processed in each dual phase shifter will be described with reference to FIG. 2. As shown differential input signals (i,ib) are supplied to the bases 44, 46 of transistors 40 and 42 respectively. Differential input signals (iq,iqb) are supplied to the base 54, 56 of transistors 50, 52 respectively. Current sources 48, 58 comprising transistor 47 and resistor and transistor 57, resistor 59, respectively controlled by bias voltage (bv) supply current to respective transistors 40, 42 and 50, 52 via degeneration resistors 43, 45 and 53, 55 respectively.

The two current sources are shown for generality. They can be replaced with resistors if desired.

Figure 3:
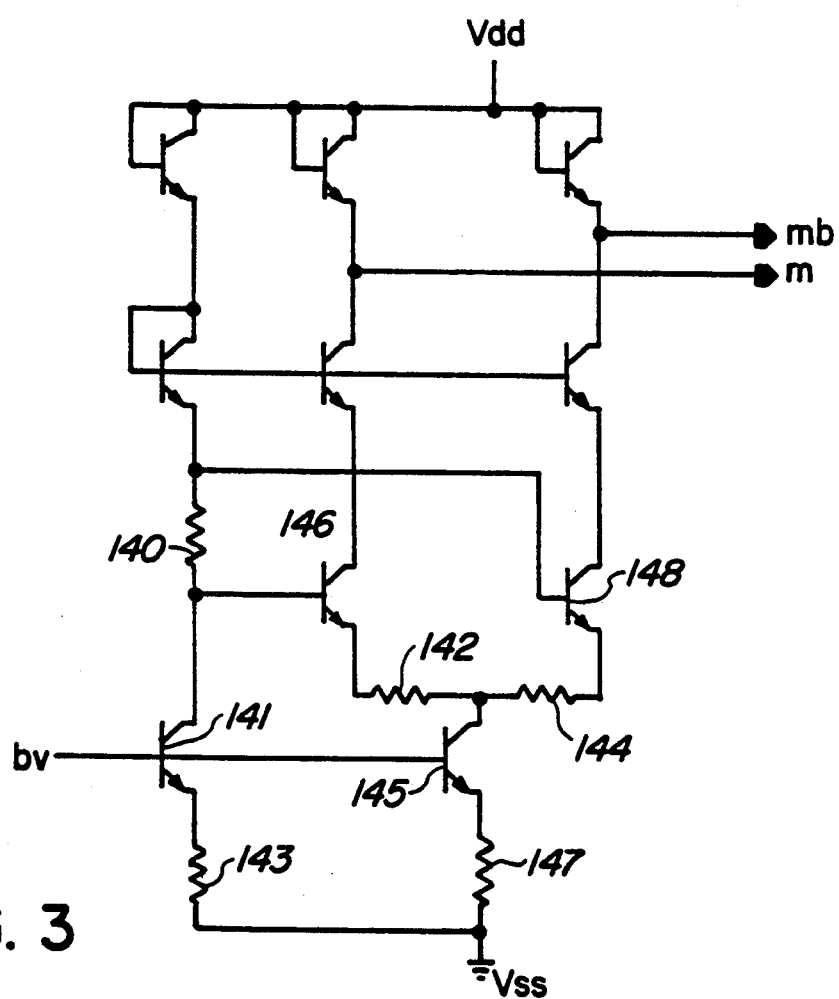
FIG. 3 is a schematic diagram of the dual phase shifter controller.

Emitter coupled second level transistors 60 and 70 are connected to the collector 61 of transistor 40. Transistors and 90, also emitter coupled, are connected to collector 81 of transistor 42. Similarly transistors 100 and 110 are connected to transistor 50 while transistors 120 and 130 are connected to transistor 52. Second level transistors 60, 70, 80, 90, 100, 110, 120 and 130 are controlled by differential inputs (m,mb) supplied by dual phase shifter controller 28 (FIGS. 1 and 3).

The operation of the dual phase shifter can be described as follows:

differential input signal (i,ib) is defined as Asin(wt) and;

(iq,iqb) as Acos(wt) where;

(i,ib) and (iq,iqb) are the quadrature input signals and A is the voltage amplitude of the input signals.

Then:

$$I_{42} = I_0 + \frac{A\sin(wt)}{R_e}$$

where:

$I_{42}$ = the collector current for transistor 42

$I_0$ = the current supplied by the current source 48 as controlled by DC bias voltage (bv). The total current supplied is $2I_0$;

$R_e$ = sum of resistors 43 and 45 also:

$$I_{44} = I_0 - \frac{A\sin(wt)}{R_e}$$

$I_{44}$ is the collector current for transistor 44. Other values as set out above.

$$I_{52} = I_0 + \frac{A\cos(wt)}{R_e}$$

and $$I_{50} = I_0 - \frac{A\cos(wt)}{R_e}$$

where $I_{52}$ = collector current for transistor 52, $I_{50}$ = collector current for transistor 50, $I_0$ = current supplied by current source 58 (total current is $2I_0$) and;

$R_e$ = sum of resistors 53 and 55.

The aforementioned collector currents are multiplied by m and (1−m) respectively, where m≦1, by the upper transistor pairs (60, 70), (80, 90), (100, 110) and (120, 130) under the DC voltage control (m,mb) as previously discussed and supplied by dual phase shifter controller 28. These multiplier circuits provide outputs (y,yb) and (yd,ydb) via summing amplifiers comprising transistors 160, 162, 164 and 166 as well as resistors 170, 172, 174 and 176. The summing amplifiers are shown for generality only.

The complementary output signals of each phase shifter (y,yb) and (yd,ydb) can be approximated as:

$$(y,yb) = 2\frac{AR_c}{R_e}[m\sin(wt) + (1-m)\cos(wt)]$$

and;

$$(yd,ydb) = 2\frac{AR_c}{R_e}[(1-m)\sin(wt) + m\cos(wt)]$$

where:

$R_c$ = load resistors (150, 152,, 154 and 156).

The phase change introduced by the propagation time through the phase shifter has been neglected in as much as only the relative phase of the four output signals is of interest and not the absolute value of the phases.

The two output signals can be rewritten as:

$$(y, yb) = A_1 \sin(wt + \phi_1) \text{ and;}$$

$$(yd, ydb) = A_1 \sin(wt + \phi_2)$$

where:

$$A_1 = 2 \frac{AR_c}{R_e} \sqrt{(1-m)^2 + m^2}$$

$$\phi_1 = \arctan \frac{1-m}{m}$$

and $$\phi_2 = \arctan \frac{m}{1-m}$$

The amplitude of the two output signals are the same, and the relative phases are $\phi_1$ and $\phi_2$. It is possible to make $\phi_1 = \pi/8$ and:

$\phi_2 = 3\pi/8$ by choosing an appropriate value of m.

The value of m is controlled by the phase shifter controller best seen in FIG. 3. The complementary outputs m and mb are controlled by choosing the appropriate ratio between resistor 140 and the sum of resistors 142 and 144. This ratio can be chosen depending on the relative phase difference desired. Control circuit 28 also includes current sources comprising transistor 141, resistor 143 and transistor 145, resistor 147. Transistors 146 and 148 provide outputs mb and m respectively.

From this analysis it is apparent that by utilizing the circuit configuration shown in FIG. 1 it is possible to generate from two differential input signals having a relative phase of $\pi/2$, four output signals having relative phases of 0, $\pi/4$, $\pi/2$, $3\pi/4$.

Figure 4:
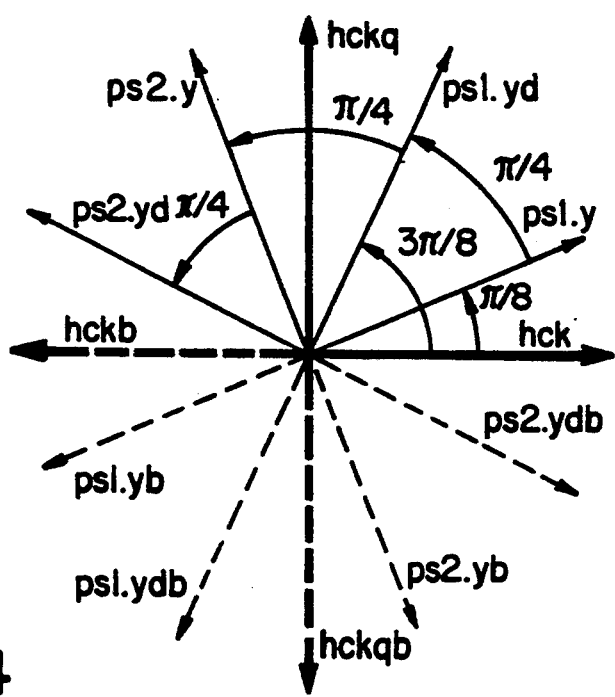
FIG. 4 illustrates the phase relationship between the quadrature input and output signals.

FIG. 4 is an illustration of the input signals and their relative phases (hck, hckb and hckq, hckqb) and the dual phase shifter outputs and their relative phases. In FIG. 4 the output signals of the two phase shifters 20 and 22 (ps1 and ps2) are identified as follows:

ps1 outputs y,yb and yd,ydb are ps1.y, ps1.yb, ps1.yd and ps1.ydb ps2 outputs y,yb and yd,ydb are ps2.y, ps2.yb, ps2.yd and ps2.ydb The output set of the four signals as shown in FIG. 4 can be seen as a pair of quadrature signals having a relative phase of $\pi/4$:

(ps1.y, ps1.yb) and (ps2.y, ps2.yb)

(ps1.yd, ps1.ydb) and (ps2.yd, ps2.ydb)

By multiplying the quadrature signals employing the circuit of FIG. 1, a pair of output signals having a frequency equal to double of the input signals can be generated. The relative phase of the output signals is $\pi/2$.

The multipliers are well known in the prior art and will not be described in detail here. It is important, however that multipliers be symmetrical in order not to introduce phase errors.

As indicated previously the circuit can operate at any frequency from DC to the maximum frequency allowed by the technology used for implementation. An exclusive-or type circuit can be used if a digital output signal is desired.

Another feature of the invention is that the basic circuit as illustated in FIG. 1 may be cascaded to double the frequncy of the quadrature output signals. In the cascade configuration the output shown as (ck,ckb) and (ckq,ckqb) are supplied to a second similar circuit as inputs (hck[1],hckb[1]) and (hckq[1],hckqb[1]). Thus the multiplication factor for a circuit having n stages is $2^n$.

While a specific embodiment of the invention has been disclosed it will be apparent to one skilled in the art that variations and alternatives to this embodiment can be implemented. It is to be understood, however, that such variations and alternatives will fall within the scope of the invention as defined in the appended claims.

I claim

1. A circuit for receiving a pair of quadrature input signals of a first frequency and to generate a pair of quadrature output signals of a second frequency, the second frequency being greater than the first frequency, said circuit comprising;

a pair of dual phase shifters, each having input means to independently receive said pair of input signals of said first frequency and processing means to generate a pair of phase shifted output signals having a phase difference therebetween;

control means connected to each of said pair of dual phase shifters having phase adjusting means to control the phase difference between said pair of phase shifted output signals;

a pair of symmetrical multipliers each receiving said pair of phase shifted output signals from said pair of dual phase shifters and generating said pair of quadrature output signals of said second frequency and;

biasing means connected to each of said pair of dual phase shifters, control means and symmetrical multipliers to provide operating voltage to said circuit.

2. The circuit as defined in claim 1, the second frequency being double said first frequency.

3. The circuit as defined in claim 1, the amplitude of said pair of quadrature input signals being substantially equal to the amplitude of said pair of quadrature output signals.

4. The circuit as defined in claim 1 fabricated on an integrated circuit.

5. The circuit as defined in claim 1 having the pair of quadrature output signals connected in cascade as second quadrature input signals to a second circuit to generate a second pair of quadrature output signals of a frequency which is double the second quadrature input signals.

6. The circuit as defined in claim 1, each of said pair of quadrature input signals comprising complementary inputs.

7. The circuit as defined in claim 6, each of said pair of phase shifters comprising a pair of multipliers having their outputs connected as summing amplifiers.

8. The circuit as defined in claim 7, each of said pair of multipliers comprising a substantially constant current source, a first pair of transistors having emitters coupled to said current source through degeneration resistors, each transistor of said pair of transistors having its collector coupled to a second pair of emitter coupled transistors having respective collectors connected to a positive source through load resistors.

9. The circuit as defined in claim 8, respective bases of said first pair of transistors of one of said pair of multipliers receives the complementary inputs of one of said pair of quadrature input signals.

10. The circuit as defined in claim 9 wherein the other of said pair of multipliers is receiving the complementary inputs of the other of said pair of quadrature input signals.

11. The circuit as defined in claim 8, the base of each of said second pair of transistors receiving complementary inputs from said control means, said complementary controlling the phase difference between said pair of phase shifted output signals.

12. The circuit as defined in claim 11, the phase difference between said phase shifted output signals being 0°, 45°, 90° and 135°.

13. A method of generating a pair of quadrature output signals from a pair of quadrature input signals, the output signals having a frequency which is double the frequency of the input signals, the method comprising:
supplying said pair of quadrature input signals to a pair of dual phase shifters, each of said pair of dual phase shifters having means to generate a pair of phase shifted output signals,
generating a differential phase control signal and supplying said control signal to each of said pair dual phase shifters to control the phase difference between said phase shifted output signals;
providing said pair of phase shifted output signals to a pair of symmetrical multipliers and;
obtaining from said multipliers said pair of quadrature output signals having a frequency which is double the frequency of the quadrature input signals.

14. The method as defined in claim 13 wherein the pair of quadrature output signals is supplied as quadrature input signals to a second doubler circuit connected in cascade so as to generate a pair of further doubled quadrature output signals.

15. The method as defined in claim 14 wherein the relative phase of the quadrature output signals is $\pi/2$.

* * * * *